US012733113B2

(12) United States Patent
Lalla et al.

(10) Patent No.: US 12,733,113 B2
(45) Date of Patent: Sep. 8, 2026

(54) FIELD DEVICE TRANSMITTER HOUSING

(71) Applicant: Endress+Hauser Flowtec AG, Reinach (CH)

(72) Inventors: Robert Lalla, Lörrach (DE); Werner Tanner, Lausen (CH); Martin Arnold, Reinach (CH)

(73) Assignee: Endress+Hauser Flowtec AG, Reinach (CH)

( * ) Notice: Subject to any disclaimer, the term of this patent is extended or adjusted under 35 U.S.C. 154(b) by 269 days.

(21) Appl. No.: 18/682,565

(22) PCT Filed: Jul. 22, 2022

(86) PCT No.: PCT/EP2022/070613
§ 371 (c)(1),
(2) Date: Feb. 9, 2024

(87) PCT Pub. No.: WO2023/016777
PCT Pub. Date: Feb. 16, 2023

(65) Prior Publication Data
US 2025/0081359 A1 Mar. 6, 2025

(30) Foreign Application Priority Data
Aug. 11, 2021 (DE) ..................... 10 2021 120 971.4

(51) Int. Cl.
*H05K 3/46* (2006.01)

(52) U.S. Cl.
CPC ................................. *H05K 3/4691* (2013.01)

(58) Field of Classification Search
CPC ...... H04Q 9/00; H04Q 2209/88; G01D 4/002; G01D 11/24; G01D 11/245; G01K 1/08;
(Continued)

(56) References Cited

U.S. PATENT DOCUMENTS 6,396,709 B1 * 5/2002 Schmich ................ H05K 1/028
439/495
10,247,876 B2 4/2019 Matsumoto
(Continued)

FOREIGN PATENT DOCUMENTS

DE 102012207599 A1 11/2013
DE 102018219225 A1 5/2019
(Continued)

*Primary Examiner* — Cindy Trandai
(74) *Attorney, Agent, or Firm* — Mark A. Logan; Endress+Hauser (USA) Holding, Inc.

(57) ABSTRACT

A transmitter housing of an automation field device is a single-chamber housing with an aperture. The field device comprises a printed circuit board arranged in the transmitter housing, the printed circuit board comprising: a first rigid and flat section and a second rigid and flat section; at least one flexible and bent section; wherein both rigid sections are connected to each other only via the at least one flexible, bent section, wherein the first rigid section is accessible from the aperture and forms a connecting region comprising at least one connecting element for connecting at least one cable, and wherein the first rigid section and the second rigid section are arranged relative to each other at a first angle of between 60° and 120°, in particular between 80° and 100°.

16 Claims, 2 Drawing Sheets

(58) Field of Classification Search
CPC ........... G01L 19/14; G01R 1/04; H01R 12/58; H01R 12/71; H01R 13/52; H05K 1/11; H05K 5/06
See application file for complete search history.

(56) References Cited

U.S. PATENT DOCUMENTS

| | | | | |
|---|---|---|---|---|
| 11,642,041 | B1 * | 5/2023 | Korhummel | A61B 5/07<br>600/302 |
| 2006/0257081 | A1 | 11/2006 | Ishigami et al. | |
| 2008/0047135 | A1 * | 2/2008 | Arnold | H05K 3/4691<br>29/829 |
| 2009/0066587 | A1 * | 3/2009 | Hayes | H01Q 1/2275<br>343/702 |
| 2015/0028730 | A1 * | 1/2015 | Loeffel | G01D 11/24<br>220/377 |
| 2015/0092363 | A1 * | 4/2015 | Blier | G02B 6/00<br>361/749 |
| 2018/0172416 | A1 * | 6/2018 | Jansson | G01B 5/016 |
| 2019/0014391 | A1 * | 1/2019 | Brockhaus | H04Q 9/00 |
| 2019/0067891 | A1 * | 2/2019 | Kubon | H01R 35/025 |
| 2020/0327974 | A1 * | 10/2020 | Melzi | A61M 5/20 |
| 2020/0405132 | A1 * | 12/2020 | Moyer | A61B 10/04 |
| 2022/0333959 | A1 * | 10/2022 | Loeken | G01D 5/145 |

FOREIGN PATENT DOCUMENTS

| | | | |
|---|---|---|---|
| DE | 102019107750 | A1 | 10/2020 |
| EP | 2219425 | A2 | 8/2010 |
| EP | 3425345 | A1 | 1/2019 |
| WO | 2021043409 | A1 | 3/2021 |

* cited by examiner

FIELD DEVICE TRANSMITTER HOUSING

CROSS-REFERENCE TO RELATED APPLICATIONS

The present application is related to and claims the priority benefit of DPMA Patent Application No. 10 2021 120 971.4, filed on Aug. 11, 2021 and International Patent Application No. PCT/EP2022/070613, filed on Jul. 22, 2022, the entire contents of which are incorporated herein by reference.

TECHNICAL FIELD

The invention relates to a transmitter housing of an automation field device.

BACKGROUND

In automation engineering, and especially in process automation engineering, field devices are frequently used to determine, monitor, optimize, and/or influence process variables. Sensors which detect process variables such as fill-level, flow rate, pressure, temperature, or conductivity serve to detect the process variables. To influence process variables, actuators, such as, for example, valves or pumps, are used, via which the flow rate of a fluid in a pipeline section or a fill-level in a container can be altered by means of actuators. In principle, all devices which are process-oriented and which supply or process process-relevant information are referred to as field devices. In connection with the invention, field devices are also understood to be remote I/O's, radio adapters, and general devices that are arranged at the field level. The applicant makes and distributes a large variety of such field devices.

Field devices often have a sensor unit, which is, in particular, at least temporarily and/or at least in portions in contact with a process medium, and which serves to generate a signal dependent upon the process variable. Furthermore, field devices often have a connecting/electronics unit arranged in a transmitter housing. The transmitter housing is, for example, fixedly connected to the sensor unit. The connecting/electronics unit is used for processing and/or forwarding, in particular, electronic signals generated by the sensor unit. Typically, the connecting/electronics unit comprises at least one printed circuit board with components arranged thereon. Cables can be connected to the connecting/electronics unit to transmit the forwarded signals to a superordinate unit and/or to supply the field device with the electrical energy required for its operation.

Often, a spatial separation of different regions of the connecting/electronics unit into an accessible connecting region and an inaccessible electronics region is desired. In this way, the electronics region is protected during work on the connecting region.

Said spatial separation is achieved in the prior art, for example, by the use of a multi-chamber housing in which the electronics region and the connecting region are accommodated in chambers with separate apertures, which chambers are spatially separated from one another. For some of the field devices, this is not always possible, or in certain cases it is preferred to use a single-chamber housing. The single-chamber housing is more cost-effective, and, possibly, only one aperture with a cover has to be used. This is advantageous for use in areas with strict hygiene requirements, for example.

SUMMARY

The invention is therefore based upon the object of specifying a simple option for spatial separation of different regions of the connecting/electronics unit for a single-chamber housing.

The object is achieved by a transmitter housing of an automation field device, wherein the transmitter housing is a single-chamber housing with one aperture,

- wherein the field device comprises a printed circuit board arranged in the transmitter housing, which printed circuit board has:
- a first rigid and flat section and a second rigid and flat section;
- at least one flexible and bent section;
- wherein the two rigid sections are connected to one another only via the at least one flexible, bent section,
- wherein the first rigid section is accessible from the aperture and forms a connecting region which has at least one connecting element for connecting at least one cable,
- and wherein the first rigid section and the second rigid section are arranged at a first angle between 60° and 120°, and in particular between 80° and 100°.

At an angle between 80° and 100°, the two rigid sections are arranged more or less perpendicular to one another or even substantially perpendicular to one another.

The automation field device comprises the printed circuit board arranged in the transmitter housing of the field device. The second section of the printed circuit board forms an electronics region. It is inaccessible from the aperture due to the angled arrangement relative to the first section and protected from access when the aperture is open.

The at least one cable serves, for example, to supply the field device with electrical energy and/or to transmit information between the field device and/or a superordinate unit connected thereto.

Printed circuit boards which have several rigid printed circuit board regions which are connected via a flexible printed circuit board region are known from the prior art. Here, a distinction is made between rigid-flex and semi-flex printed circuit boards. Rigid-flex printed circuit boards have rigid sections, connected to one another via a flexible section, which can essentially be arranged arbitrarily with respect to one another.

In the case of semi-flex printed circuit boards, on the other hand, a semi-flexible region is produced by defined depth milling of an intermediate region from a uniform, initial printed circuit board. The rigid sections lying in the plane of the initial printed circuit board can then be arranged at a virtually arbitrary angle relative to one another by bending the semi-flexible region. Semi-flex printed circuit boards offer significant cost advantages in manufacturing compared to the classic rigid-flex, polyimide-based printed circuit board. For example, a special thermal pretreatment during soldering is no longer necessary for the semi-flex printed circuit board due to the usually polyimide-free structure thereof.

The semi-flex technology is, in particular, suitable for applications in which no dynamic loading of the bent, flexible section occurs. This is the case here, since bending of the bent, flexible section of the printed circuit board generally takes place only once, viz., before the printed circuit board is mounted into the transmitter housing. Preferably, the printed circuit board is therefore a semi-flex printed circuit board of this type.

In one embodiment of the invention, the transmitter housing has a removable cover by means of which the aperture can be closed. The cover can, in particular, be screwed to a housing part corresponding to the cover.

In one embodiment of the invention, the single-chamber housing has exactly one aperture.

In one embodiment of the invention, the plane of the aperture is substantially parallel to the plane of the first rigid section. The first section is thereby optimally accessible via the aperture.

In one embodiment of the invention, the transmitter housing has at least two flexible, bent sections.

In particular, the at least two bent flexible sections are arranged substantially parallel to one another.

In one embodiment of the invention, in a transverse direction, the flexible sections have a width that is smaller than the width of the first rigid section and/or the second rigid section, and, in particular, in the transverse direction is at most 0.5, and preferably at most 0.3, times as wide as the first rigid section and/or the second rigid section, which transverse direction runs substantially perpendicular to a connection direction, along which connection direction the sections of the printed circuit board, viz., the first rigid section, the flexible sections, and the second rigid section, are connected to one another.

In a development of one of the two last-mentioned embodiments, the printed circuit board has exactly two flexible sections which each connect two outer edge regions of the two rigid sections to one another.

In one embodiment of the invention, the printed circuit board has a recess, which recess extends

- between the at least one flexible section and the second section, and,
- in the event that the printed circuit board has at least two flexible sections, between regions not connected to one another of the first rigid section and the second rigid section.

The recess is milled, for example, into the printed circuit board. The milling of the recess into the printed circuit board is preferably carried out during deep milling for generating the flexible section in the case of the aforementioned semi-flex printed circuit board.

In the event that the printed circuit board has exactly one flexible section, the recess extends only between the flexible section and the second section.

In a development of the last-mentioned embodiment, the second rigid section has a projection delimited by the recess, wherein the projection,

- at its first end, has a leading edge facing the first section, which leading edge terminates the projection,
- has a base at its second end opposite the first end, on which base the projection adjoins the remaining region of the second rigid section without a projection, wherein the base abuts the connection between the second rigid section and the at least one flexible section, and wherein the leading edge is outside the contour of the flexible section and faces the aperture so that the projection is accessible from the aperture.

In the context of the application, the term, "leading edge," denotes only the front end of the projection which faces the first section. It does not imply that this termination must necessarily be straight; the leading edge may also be bent, for example.

The projection lies outside the contour of the flexible termination and therefore extends into a space above the bent surface with a positive curvature of the bent flexible section. The projection protrudes such that it is accessible from the aperture. As a result, additional components accessible from there can also be arranged on the projection of the second section, such as further connecting elements.

In one embodiment of the invention, the at least one flexible bent section is bent substantially with a constant curvature definable by means of a radius of curvature, so that it is circular segment-shaped with respect to an imaginary circle center.

The angle covered by the circular segment-shaped, flexible bent section corresponds to the aforementioned first angle between the first and second rigid sections. It is therefore also between 60° and 120°, and in particular between 80° and 100°.

In a development of the last-mentioned embodiment, the length of the projection is dimensioned from the base up to the leading edge as a function of the radius of curvature such that a second angle between a vector pointing from the circle center to the base and a vector pointing from the circle center to the leading edge is between 10° and 80°, and in particular between 15° and 50°.

In one embodiment of the invention, a connecting element is arranged on the projection.

In one embodiment of the invention, at least one operable switch element is arranged on the first section and/or the projection of the second section.

In one embodiment of the invention, the transmitter housing is at least partially electrically conductive and has an electrically-conductive web extending into the housing interior, wherein a connecting element comprising an electrically-conductive fastening means is arranged on the first section for fastening the printed circuit board to the web, wherein, at the connecting element, a grounding cable can be connected to the transmitter housing such that the grounding cable is electrically-conductively connected to the web by means of the fastening means when fastened to the web, for shielding the transmitter housing.

Said fastening means is designed, for example, as a metallic screw or clamp. It serves to simultaneously fasten the printed circuit board to the web and the electrical shielding of the transmitter housing; the latter by using a grounding cable connected by means of the fastening means.

In one embodiment of the invention, at least one region of the printed circuit board is substantially completely encapsulated, which completely encapsulated region comprises the second rigid section of the printed circuit board without the projection.

The encapsulated region is encapsulated, for example, by means of a housing body, and optionally also with additional potting.

In one embodiment of the invention, the printed circuit board is substantially completely encapsulated, except for the connecting element(s) and, if present, except for the switching element(s).

BRIEF DESCRIPTION OF THE DRAWINGS

The present disclosure will be explained further with reference to the figures, which are not true-to-scale, wherein the same reference signs designate the same features. For reasons of clarity, or if it appears sensible for other reasons, previously-noted reference signs will not be repeated in the following figures.

Figure 1A:
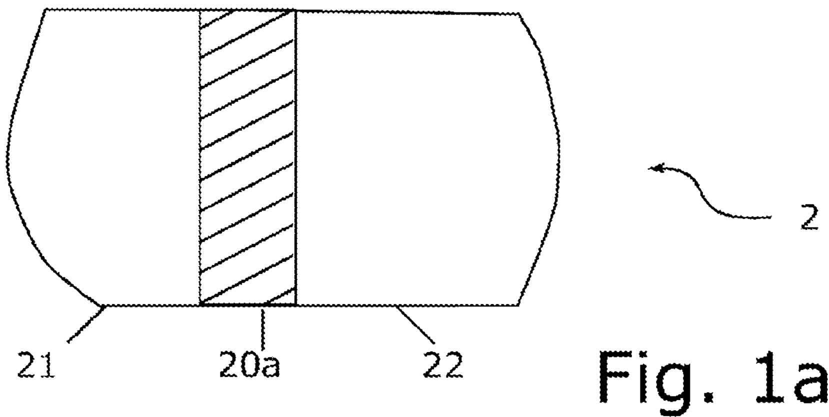
FIGS. 1*a*, 1*b*, 1*c* show a plan view of the printed circuit board before bending of the flexible, bent section, in each case in different embodiments of the printed circuit board.
Figure 1B:
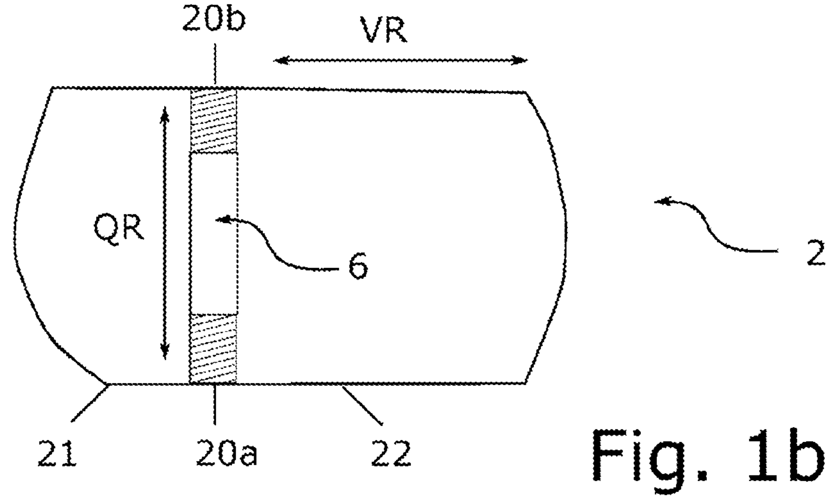
Figure 1C:
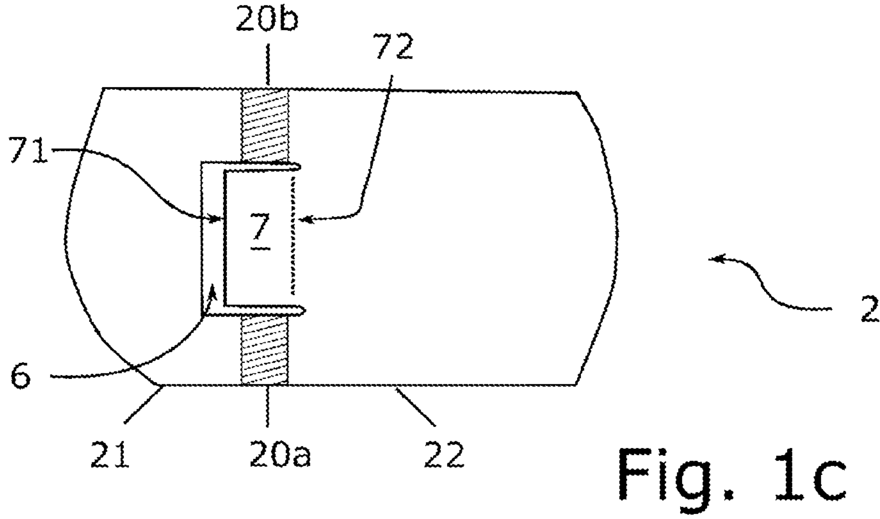

For the sake of clarity, the printed circuit boards 2 are shown in the plan views from FIGS. 1*a* through 1*c* with a flexible section 20*a*; 20*b* not yet bent, so that all sections 21, 22, 20*a*; 20*b* of the printed circuit board 2 are in one plane. As mentioned above, the printed circuit board 2 is preferably designed as a semi-flex printed circuit board with the at least one flexible bendable (or, in the context of the invention, bent) section 20*a*; 20*b*. In the latter, a flexible section 20*a*; 20*b*, . . . is obtained by deep milling of the section 20*a*; 20*b* from a uniform, initial printed circuit board. The two rigid sections 21, 22 are connected to one another exclusively via the flexible section 20*a*; 20*b*.

In FIG. 1*a*, the printed circuit board 2 comprises exactly one flexible section 20*a*.

In FIG. 1*b*, the printed circuit board 2 comprises exactly two flexible sections 20*a*, 20*b* which connect edge regions of the two rigid sections 21, 22 to one another. A recess 6 is arranged between the two rigid sections 21, 22. The recess 6 extends between unconnected regions of the two rigid sections 21, 22 and between the flexible sections 20*a*, 20*b* in each case.

Preferably, the flexible sections 20*a*, 20*b* are narrower than the rigid sections 21, 22 in the transverse direction QR, which is perpendicular to a connection direction VR of the sections 21, 20*a*, 20*b*, 22 of the printed circuit board 2. For example, the flexible section is only 0.3 times as wide in the transverse direction QR as each of the rigid sections 21, 22. Here, the rigid sections 21, 22 each have the same width in the transverse direction QR. In the case of several flexible sections 20*a*, 20*b*, . . . , the flexible sections 20*a*, 20*b*, . . . are preferably arranged substantially parallel to one another.

In FIG. 1*c*, the printed circuit board 2 substantially corresponds to the embodiment of the printed circuit board shown in FIG. 1*b*, except that the recess 6 delimits a projection 7 of the second rigid section 22. Thus, in FIG. 1*c*, the recess 6 extends between the second rigid section 22 and the two flexible sections 20*a*, 20*b*. The projection merges at a base 72 with the remaining region of the second rigid section 22 and terminates at an end, facing the first rigid section 21, with a leading edge 71. The leading edge 71 does not necessarily have to be straight, as shown here. The recess 6 is here substantially C-shaped.

Figure 3A:
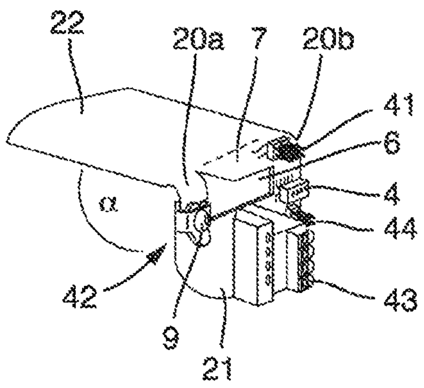
FIGS. 3*a*, 3*b* show a perspectival view of the printed circuit board and a side view of the printed circuit board, in one embodiment of the present disclosure.

FIG. 3*a* shows, in a perspectival view, such a printed circuit board 2 with a projection 71 of the second rigid section 22, which projection is delimited by a recess 6 and in which the flexible sections 20*a*, 20*b* are bent. The first rigid section 21 and the second rigid section 22 are arranged substantially perpendicular to one another, i.e., with a first angle alpha of 90°. Different connecting elements 4, 42, 43, 44 are arranged on the first section 21, including, for example, a four-pole connecting element 43.

One of the connecting elements 42 comprises a fastening means 9 (here, a metallic screw) for connecting a grounding cable. A further connecting element 41 is arranged on the projection 7.

Figure 2:
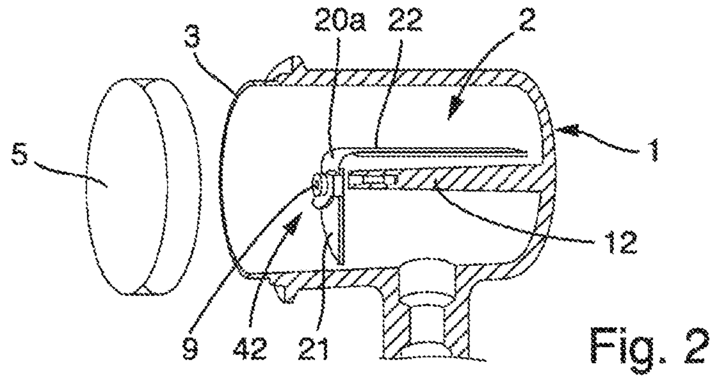
FIG. 2 shows a perspectival view of the transmitter housing with the printed circuit board arranged therein, in one embodiment of the present disclosure.

FIG. 2 shows an arrangement of an embodiment of a printed circuit board 2 according to the invention within a single-chamber transmitter housing 1. In the variant of the printed circuit board shown in FIG. 2, the printed circuit board 2 does not comprise a projection 7 for the sake of clarity. The printed circuit board 2 is arranged in the transmitter housing 1 such that the first rigid section 21 with the connecting elements 4, 42, 43, 44 is easily accessible from an aperture 3 of the transmitter housing 1—for example, by the plane of the aperture 3 being parallel to the plane of the first rigid section 21. If the cover 5 of the transmitter housing 1 is unscrewed, connection work can be performed on the connecting elements 4, 42, 43, 44, wherein components arranged on the second rigid section 22 are protected from access due to the substantially right-angled arrangement.

FIG. 2 also shows the fastening of the fastening means 9 of the connecting element 42 to an electrically-conductive web 12 of the transmitter housing 1, which extends into the housing interior. A shielding of the transmitter housing 1 is created when a grounding cable is connected to the connecting element 42 and an at least partially electrically-conductive transmitter housing 1. A shielding and an additional fastening of the printed circuit board 2 to the web 12 are thus preferably made possible at the same time—wherein, of course, further fastening means that serve only to mechanically fasten the printed circuit board 2 in the transmitter housing 1 can be provided for safety purposes.

If the second rigid section 22 also comprises the projection 7, as shown in FIG. 3*a*, the components arranged thereon are still accessible. Since the leading edge 71 lies outside the contour of the flexible section 20*a*, the space can thereby be optimally utilized. In FIG. 3*a*, an additional connection plug element 41, which is itself angled, is arranged on the projection 7, for example. Such connection plug elements can be arranged excellently on the projection 7. Irrespective of the particular embodiment, in the solution according to the invention, all components arranged on the further region of the second section 22 (i.e., outside of the projection 7) are still protected from access in the case of connection work on the connecting region.

Figure 3B:
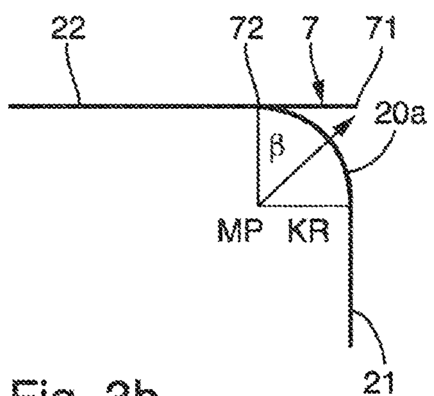

FIG. 3*b* once again shows a side view of the printed circuit board 2 with the bent flexible sections 20*a*, 20*b*. Here, the flexible section is circular segment-shaped, wherein its shape can be defined by means of a radius of curvature KR of constant curvature in relation to an imaginary circle center MP. The covered angle of the circle segment corresponds to the aforementioned first angle alpha. The leading edge 71 of the projection 7 may protrude from the contour such that it pierces the plane of the first rigid section 21, as is the case in FIG. 3*a*. A shorter projection 7 may also terminate with its leading edge 71 in front of the plane of the second rigid section 21.

The length of the projection 7 from the base 72 to the leading edge 71 can thereby be defined by means of a second angle beta which lies between the vector from the center MP to the leading edge 71 and the vector from the center MP to the base 72. The second angle beta is preferably between 15° and 50° and is, for example, 30°. The length of the vector center MP base 72 corresponds to the radius of curvature KR of the predefined, constant curvature of the flexible sections 20*a*, 20*b*, wherein, in the case of several flexible sections 20*a*, 20*b*, which are parallel to one another, the curvature is always the same. With a given radius of curvature KR and center MP, the length of the projection 7 can therefore be defined on the basis of the second angle beta.

In the context of the invention, the substantially right-angled arrangement of the two rigid sections 21, 22 shown in FIGS. 2, 3*a*, 3*b* is suitable especially for the type of transmitter housing 1 shown in FIG. 2. Depending upon the use of the field device (for example, due to hygiene requirements), transmitter housings 1 are also used which are themselves angled, in which, for example, the plane of the aperture 3 runs slightly obliquely in relation to an otherwise cylindrical transmitter housing 1. In this case, an arrangement of the two rigid sections 21, 22 is also adapted to the shape of the transmitter housing 1, and the first angle alpha is correspondingly greater and is, for example, 100°.

Figure 4:
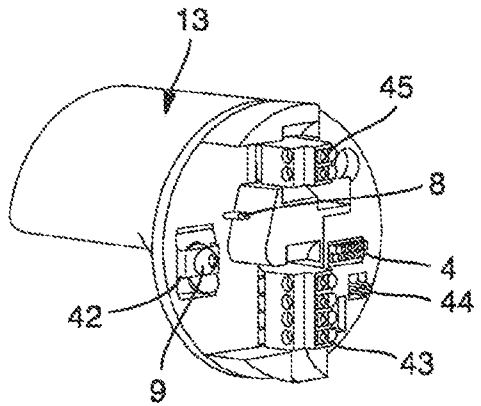
FIG. 4 shows a perspectival view of a printed circuit board encapsulated in a housing, in one embodiment of the present disclosure.

FIG. 4, finally, shows the encapsulation of the printed circuit board 2 in a housing body 13. In this embodiment, the second rigid section 22 has no projection 7 again for the sake of clarity, wherein the invention also comprises the combination of the embodiment with the projection 7 and the housing body 13. The first housing section 21 further comprises a switching element 8. Of course, when a projection 7 is used, a switching element may also be arranged on the projection.

The printed circuit board 2 is substantially completely encapsulated by means of the housing body 13. Only the connecting elements 4, 42, 43, 44 and the switching element 8 on the first section 21 remain free of the encapsulation. A potting compound may additionally be filled into the housing body 13. The housing body 13 is then arranged completely in the single-chamber transmitter housing 1 such that the first section 21 of the printed circuit board 2 is accessible from the aperture 3 of the transmitter housing 1.

The invention claimed is:

1. A transmitter housing of an automation field device, wherein the transmitter housing is a single-chamber housing having an aperture, wherein the field device includes a printed circuit board arranged in the transmitter housing, wherein the printed circuitboard has a first rigid and flat section, a second rigid and flat section, at least one flexible and bent section, and a recess extending at least between the at least one flexible and bent section and the second rigid and flat section, wherein the two rigid and flat sections are connected to one another only via the at least one flexible and bent section, wherein the first rigid and flat section is accessible from the aperture and forms a connecting region which has at least one connecting element for connecting at least one cable, and wherein the first rigid and flat section and the second rigid and flat section are arranged relative to each other at a first angle between 60° and 120°, wherein the second rigid and flat section has a projection delimited by the recess, wherein the projection at its first end has a leading edge facing the first rigid and flat section, and the leading edge terminates the projection and has a base at its second end opposite the first end on which the projection adjoins a remaining region of the second rigid and flat section without a projection, wherein the base abuts the connection between the second rigid and flat section and the at least one flexible and bent section, and wherein the leading edge lies outside a contour of the at least one flexible and bent section and faces the aperture so that the projection is accessible from the aperture.

2. The transmitter housing according to claim 1, further including a removable cover via which the aperture can be closed.

3. The transmitter housing according to claim 2, wherein the single-chamber housing has exactly one aperture.

4. The transmitter housing according to claim 1, wherein a plane of the aperture is parallel to a plane of the first rigid and flat section.

5. The transmitter housing according to claim 1, wherein the at least one flexible and bent section of the printed circuit board includes atleast two flexible and bent sections, and the recess further extends between regions not connected to each other of the first rigid and flat section and the second rigid and flat section.

6. The transmitter housing accordingto claim 5, wherein the at least two flexible and bent sections, in a transverse direction perpendicular to a connection direction along which the first rigid and flat section, the at least two flexible and bent sections, and the second rigid and flat section are connected to one another, have a width smaller than a width of the first rigid and flat section and/or a width of the second rigid and flat section.

7. The transmitter housing according to claim 6, wherein the printed circuit board has exactly two flexible and bent sections that each connect two outer edge regions of the two rigid and flat sections to one another.

8. The transmitter housing according to claim 1, wherein the at least one flexible and bent section is bent with a constant curvature defined by a radius of curvature so that it is circular segment-shaped with respect to an imaginary circle center.

9. The transmitter housing according to claim 8, wherein a length of the projection from the base to the leading edge is dimensioned as a function of the radius of curvature such that a second angle between a vector pointing from the circle center to the base and a vector pointing from the circle center to the leading edge is between 10° and 80°.

10. The transmitter housing according to claim 9, wherein a connecting element is arranged on the projection.

11. The transmitter housing according to claim 9, wherein at least one operable switching element is arranged on the first rigid and flat section and/or the projection of the second rigid and flat section.

12. The transmitter housing according to claim 1, wherein the transmitter housing is at least partially electrically conductive and has an electrically-conductive web extending into the housing interior, wherein a connecting element comprising an electrically-conductive fastening means is arranged on the first rigid and flat section for fastening the printed circuit board to the web, and wherein, at the connecting element, a grounding cable can be connected to the transmitter housing such that the grounding cable is electrically conductively connected to the web via the fastening means when attached to the web for shielding the transmitter housing.

13. The transmitter housing according to claim 1, wherein at least one region of the printed circuit board is encapsulated, and wherein the encapsulated at least one region includes the second rigid and flat section of the printed circuit board without the projection.

14. The transmitter housing according to claim 13, wherein the printed circuit board is completely encapsulated, except for the connecting elements and, if present, except for the switching elements.

15. The transmitter housing according to claim 1, wherein in the event that the printed circuit board has exactly one flexible section, the recess extends only between the flexible section and the second rigid and flat section.

16. The transmitter housing according to claim 1, wherein in the event the printed circuit board comprises two flexible sections, the recess extends between unconnected regions of the first rigid and flat section and the second rigid and flat section and between the two flexible and bent sections.

* * * * *